US006821834B2

(12) United States Patent
Ando

(10) Patent No.: US 6,821,834 B2
(45) Date of Patent: Nov. 23, 2004

(54) ION IMPLANTATION METHODS AND TRANSISTOR CELL LAYOUT FOR FIN TYPE TRANSISTORS

(76) Inventor: Yoshiyuki Ando, Nishi 3-2-62 Kunitachi-shi, Tokyo (JP), 186-0005

( * ) Notice: Subject to any disclaimer, the term of this patent is extended or adjusted under 35 U.S.C. 154(b) by 44 days.

(21) Appl. No.: 10/065,955

(22) Filed: Dec. 4, 2002

(65) Prior Publication Data

US 2004/0108545 A1 Jun. 10, 2004

(51) Int. Cl.$^7$ ............... H01L 21/8238; H01L 21/336; H01L 21/3205; H01L 21/00; H01L 29/76
(52) U.S. Cl. ............ 438/212; 438/259; 438/270; 438/271; 438/589; 438/151; 257/329; 257/330; 257/331; 257/369; 257/347; 257/350; 257/351; 257/345
(58) Field of Search .................... 257/329, 330, 257/331, 347, 350, 351, 345, 369; 438/212, 259, 270, 271, 589, 151

(56) References Cited

U.S. PATENT DOCUMENTS 5,844,278 A * 12/1998 Mizuno et al. ............. 257/345
6,255,699 B1 * 7/2001 Bracchitta et al. .......... 257/369
6,413,802 B1 * 7/2002 Hu et al. .................... 438/151

* cited by examiner

Primary Examiner—Steven Loke
(74) Attorney, Agent, or Firm—Richard D. Fuerle

(57) ABSTRACT

Fin-type field effect transistors are fabricated on a semiconductor substrate. Rectangular fins are formed on the substrate in a rectangular pattern of rows and columns and gate electrodes are deposited on at least two sides of the fins. The gate electrodes are implanted with ions at an angle θ to a line perpendicular to the substrate, such that D≈H tan θ, where D is the distance between fins in adjacent rows or columns and H is the height of the fins.

25 Claims, 24 Drawing Sheets

ION IMPLANTATION METHODS AND TRANSISTOR CELL LAYOUT FOR FIN TYPE TRANSISTORS

BACKGROUND OF THE INVENTION

This invention relates to the fabrication of a fin-type a metal oxide field effect transistor (MOS FET) integrated circuit (IC). In particular, it relates to placing the fins used to make fin-shaped MOS FET transistors on a substrate in a rectangular pattern of rows and columns and using adjacent fins as shields during irradiation with particles or light.

The continuing movement of integrated circuit technology toward smaller scales is making system level integration on a chip both possible and desirable. The conventional MOS transistor structure is a planer type in which current flows horizontally from source to drain. As transistor size shrinks to below about 0.1 μm, the channel controlled by the gate also shrinks and unwanted couplings occur between the source and the drain, which is known as the "short channel problem." The short channel problem also increases power consumption and the difficulty of designing a properly functioning circuit.

A fin transistor (also known as a "pillar transistor") increases the size of the channel and reduces or eliminates the adverse effects of a short channel. Fin transistors can achieve a higher performance of current derivability because a fin transistor has a greater current flow area surrounding the gate or it uses a double gate. There are many inventions for fin-type MOSFET structures but because that structure is different from conventional planar transistors, new layout rules and manufacturing methods must be used when it is formed into an integrated circuit.

Referring to FIGS. 1a and 1b, fin-type MOS transistor 1 has substrate 2 that forms fin 3 having top 4 and two sidewalls 5. Over top 4 and sidewalls 5 of fin 3 is gate oxide 6 which is coated with conductive gate 7. Drain 8 and source 9 are on opposite sides of gate 7 at top 4 and sidewalls 5 of fin 3. (See also FIG. 2a of U.S. Pat. No. 5,844,278.) Because there are current flow channels under gate oxide layer 6 at both top 4 and the two sidewalls 5 of fin 3, this structure has an increased channel area which increases current gain. FIGS. 1c and 1d show another kind of a fin-type MOS transistor. The transistor in FIGS. 1c and 1d has two channel areas on the sidewalls but does not have a channel area on the top of the fin. This structure is known as a dual gate or double gate transistor.

FIGS. 2a and 2b illustrate another fin-type MOS transistor structure known as a surrounded gate transistor (SGT) or a vertical transistor. (See Takato et al., "High Performance CMOS surrounding Gates Transistor (SGT) for Ultra High Density LSIs," pages 222–225, IEEE Electron Device Meeting (1988)). In FIGS. 2a and 2b, fin transistor 10 has substrate 11 which forms fin 12. Fin 12 is surrounded by gate oxide 13, which is covered by gate electrode 14. Drain 15 is at the top of fin 12 and source 16 covers substrate 11. Current flows through all four sidewall channels, which are controlled by surrounding gate electrode 14.

The fins can be fabricated on a bulk silicon substrate or on an SOI (silicon on insulator) deposited silicon layer. The fins are formed by selectively etching the substrate using RIE (reactive ion etching) techniques or by depositing amorphous silicon by a conventional CVD (chemical vapor deposition) technique., FIGS. 3a to 3c show examples of conventional ion implantation processes for making planar silicon complementary metal oxide semiconductor (CMOS)large scale integrated circuits (LSI). In FIG. 3a, N-type silicon substrate 17 has been coated with photoresist layer 18, which has been exposed to light and etched away at 19. Ion implantation with boron from the direction shown by the arrows creates P-type well 20. In FIG. 3b, substrate 21 of N-type silicon has been coated with a photoresist 22 which has been developed and etched away elsewhere. Gate oxide 23 and gate electrode 24 have been deposited and boron ion implantation from the direction of the arrows has formed a P-type diffusion layer 25. The resulting P-channel transistor has source 26 and drain 27.

In FIG. 3c, boron ion implantation was used to create P-type well 28 in an N-type silicon substrate 29 and phosphorus or arsenic ion implantation formed source 30 and drain 31.

SUMMARY OF INVENTION

An object of the present invention is to provide high performance, area-efficient fin-type MOS FET manufacturing methods, without the need for special processes, and to reduce the need for masking processes such as ion implantation.

Another object of the invention is to provide high performance, area-efficient fin-type MOS FET layout methods for large scale integrated circuits (LSI).

MOS FET ICs made according to the method of this invention have an ultra-high integration density and a higher performance for short channels and low operation voltages than ICs made with conventional planar type MOS FET transistors.

BRIEF DESCRIPTION OF DRAWINGS

FIG. 1b is a cross-sectional view through B—B in FIG. 1a.

FIG. 2b is a cross-sectional view through B—B in FIG. 2a.

DETAILED DESCRIPTION

It will be understood from this description that the present invention can be implemented in conventional MOSFET technology, and that the described embodiments will operate accordingly if designed and fabricated in accordance with known complementary metal oxide semiconductor (CMOS) and silicon on insulator (SOI) rules and methodologies. These rules and methodologies are well-known in the art and will not be repeated for this description. SOI materials meeting this criterion are well-known in the art. In this invention, the term "fin transistor" includes both the structures of FIGS. 1a, 1b, 1c, 1d, 2a, and 2b, as well as related structures where the channels are on 2, 3, or 4 sides, and the embodiments shown in the other drawings are applicable to any of these structures unless otherwise noted.

Figure 17:
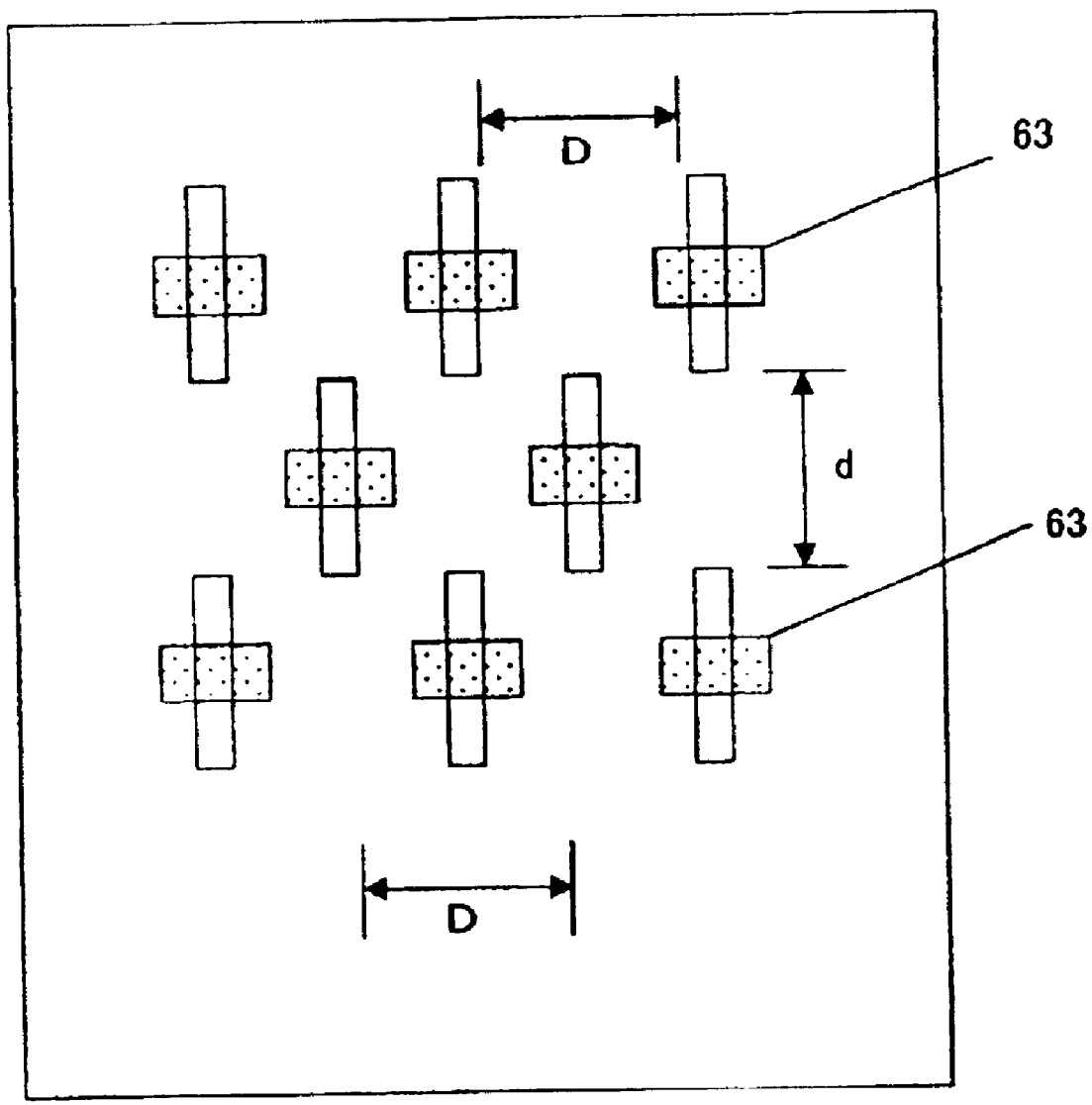
FIG. 17 is a plan view showing a checkerboard pattern of transistors on a substrate.

In this invention, the fins of fin transistors are arranged in rectangular patterns of rows and columns. The fins can occupy each square in a grid of rows and columns, as in FIG. 5, which will be called a "square pattern," Alternatively, the fins can occupy every other position in each row and column, where each row is offset by one fin from the adjacent row, which will be called a "checkerboard pattern," as shown in FIG. 17.

The checkerboard pattern permits a higher packing of the transistors, but the square pattern is more suitable for other purposes, such as when the fins are elongated and more than one transistor is fabricated on each fin. Other patterns and combinations of square and checkerboard patterns can also be used, as long as the fins are positioned to shield the substrate in between them during angled radiation.

Figure 1A:
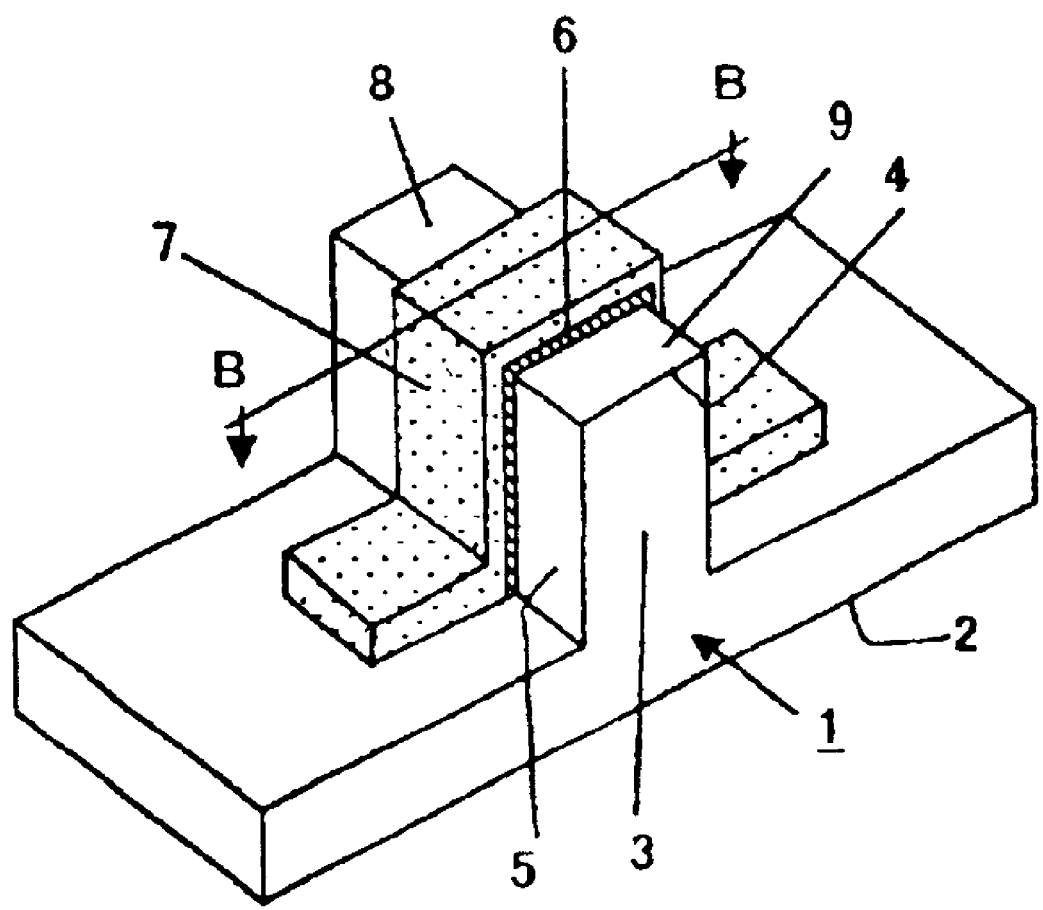
FIG. 1a is an isometric view showing the structure of a fin-type transistor.
Figure 1B:
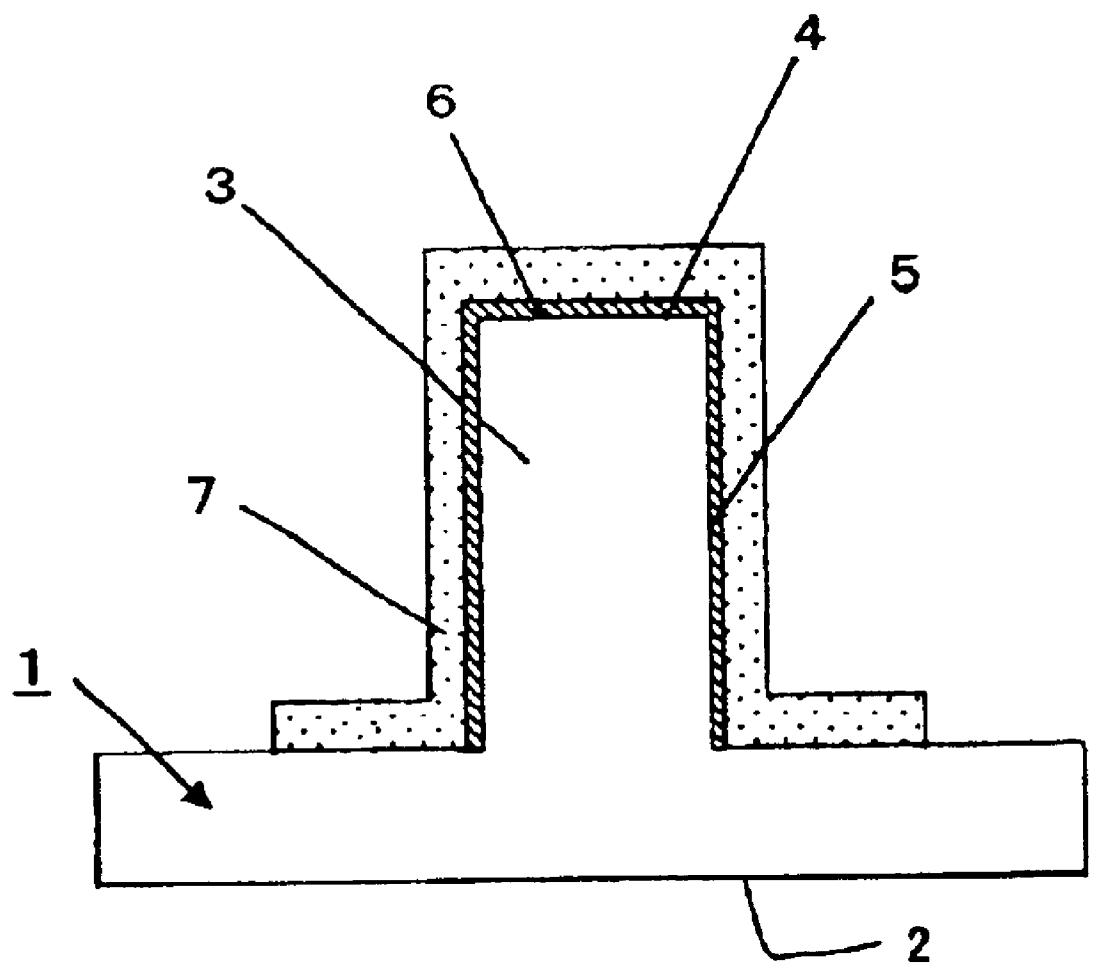
Figure 1C:
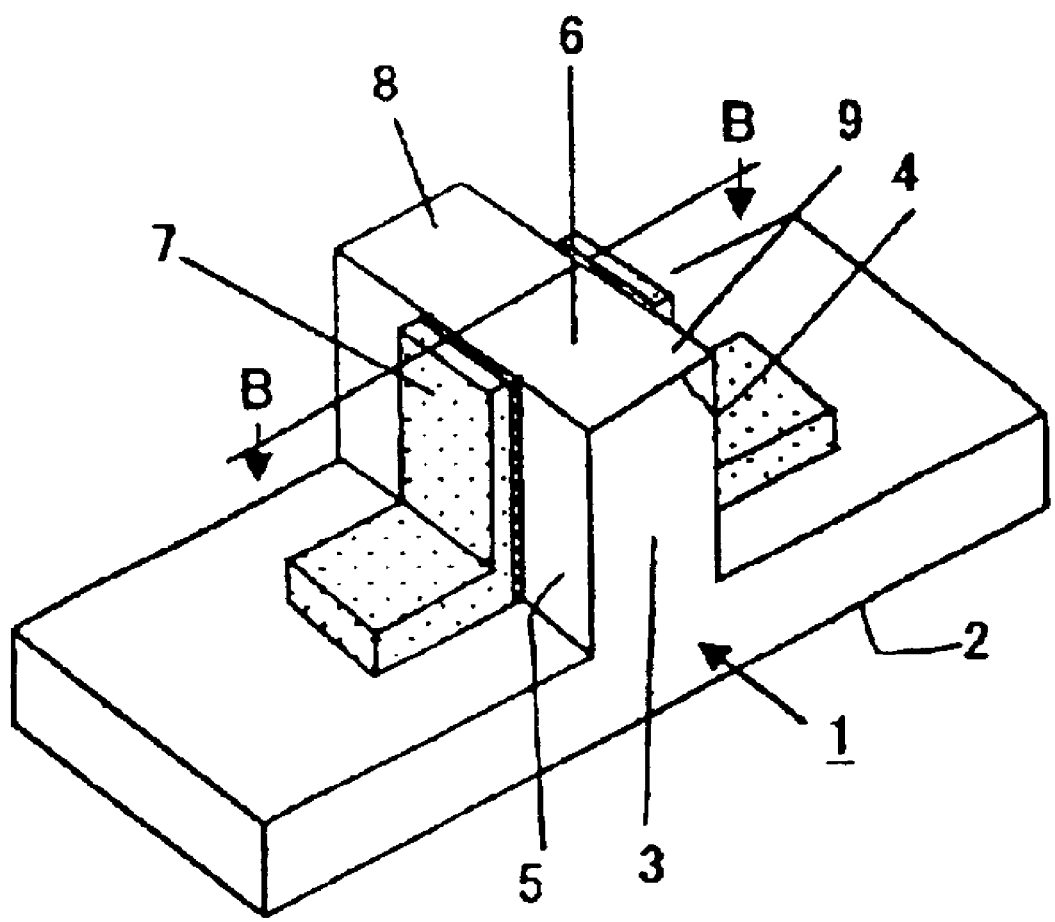
FIG. 1c is an isometric view showing the structure of a dual gate transistor.
Figure 1D:
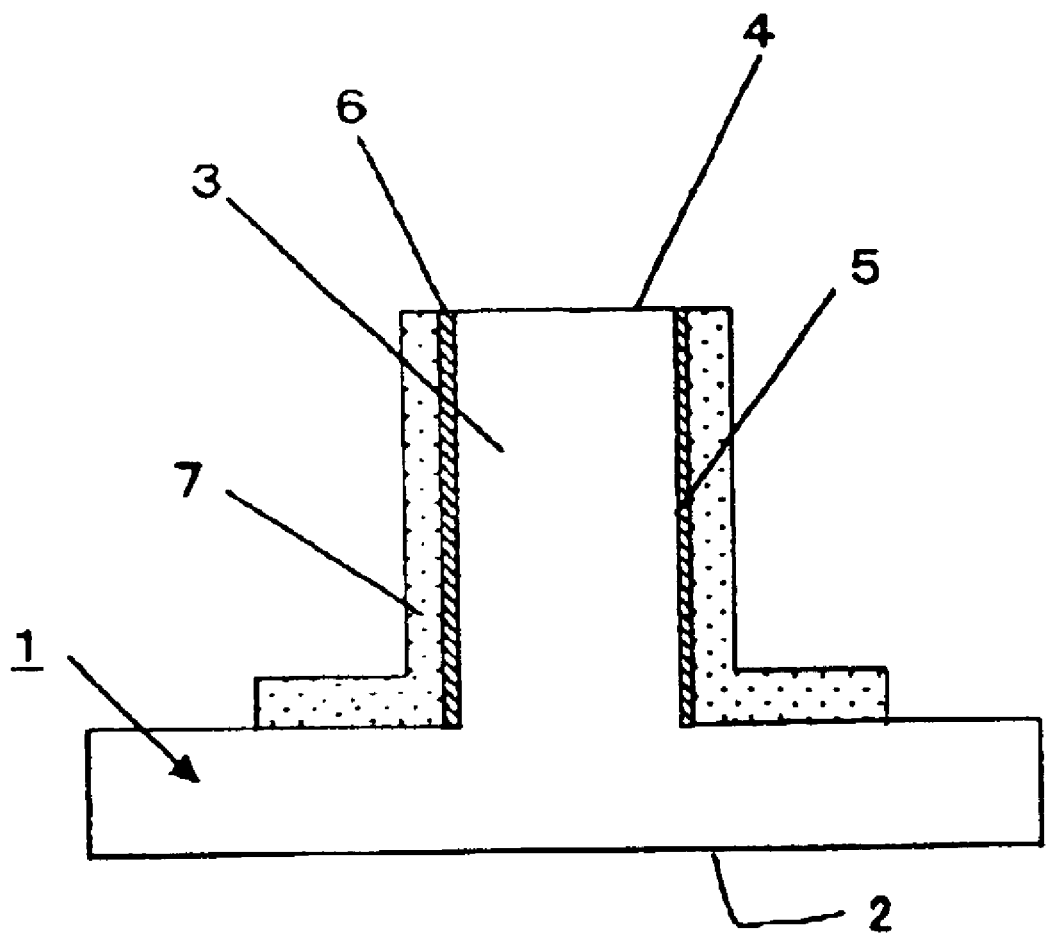
FIG. 1d is a cross-sectional view through B—B in FIG. 1c.
Figure 2A:
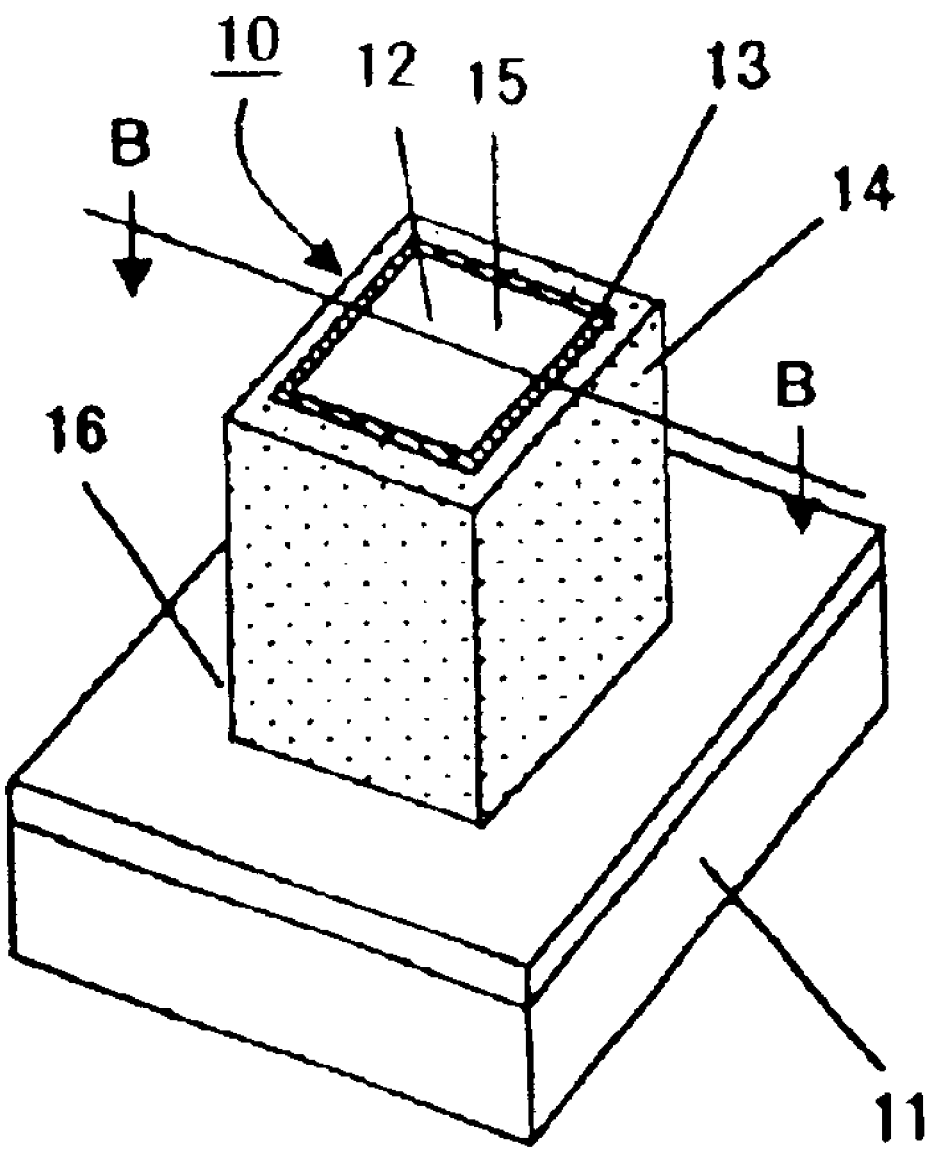
FIG. 2a is an isometric view showing the structure of another fin-type transistor.
Figure 2B:
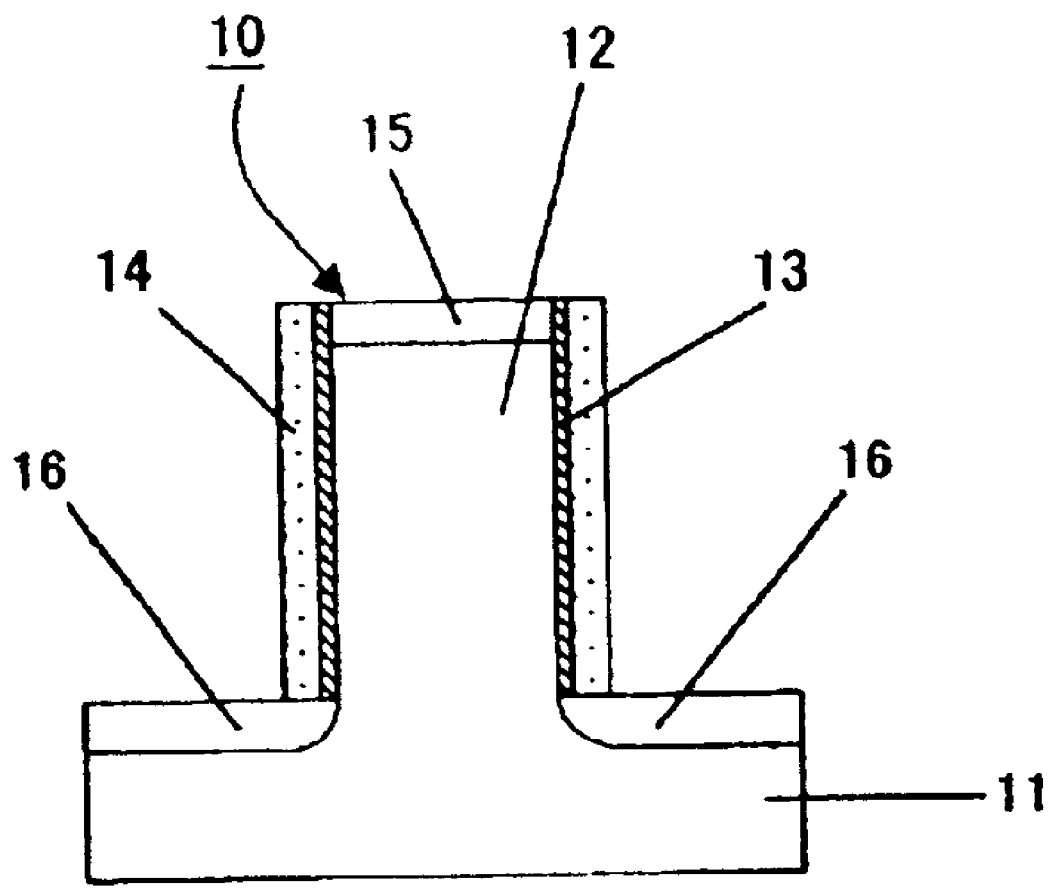
Figure 3A:
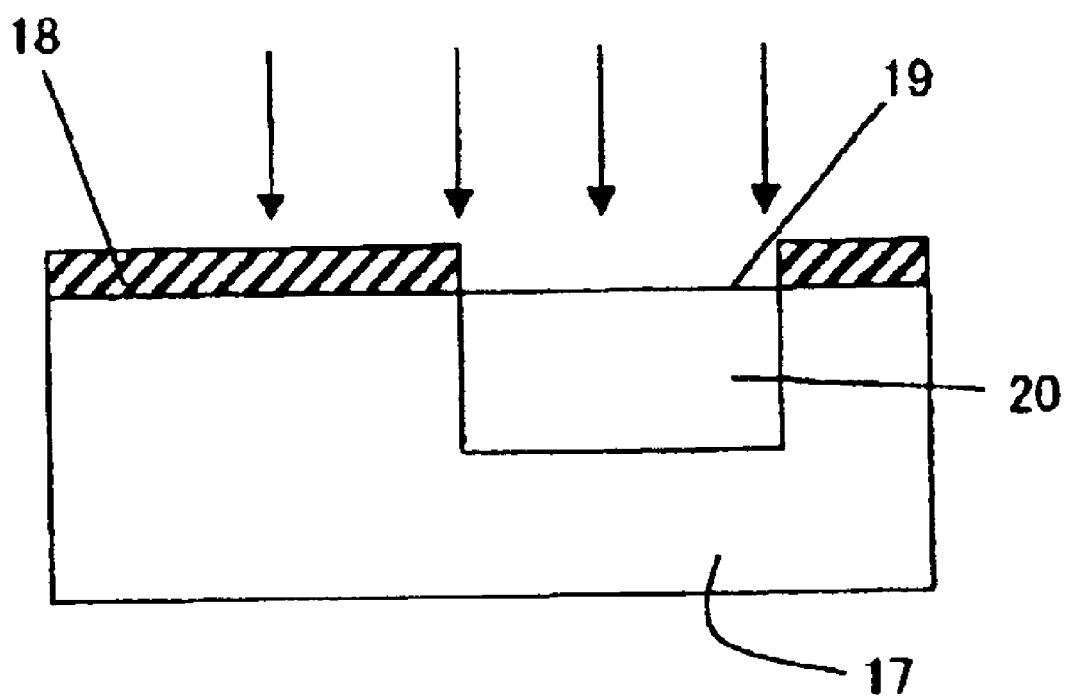
FIGS. 3a to 3c are front views in section illustrating ion implantation process steps for making a conventional planar CMOS LSI.
Figure 3B:
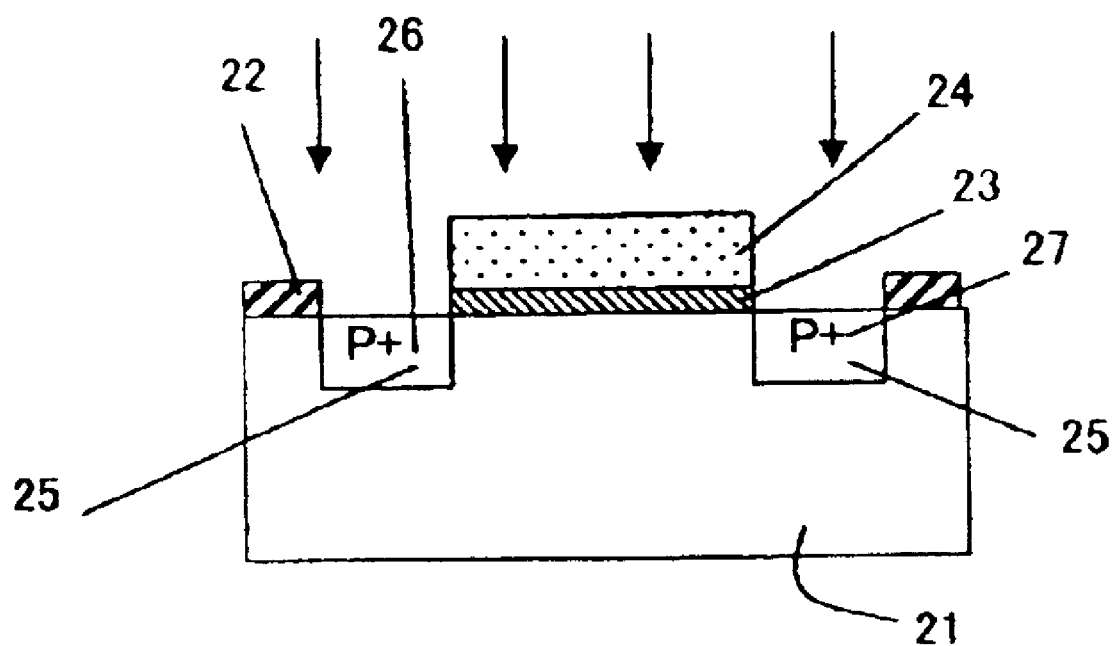
Figure 3C:
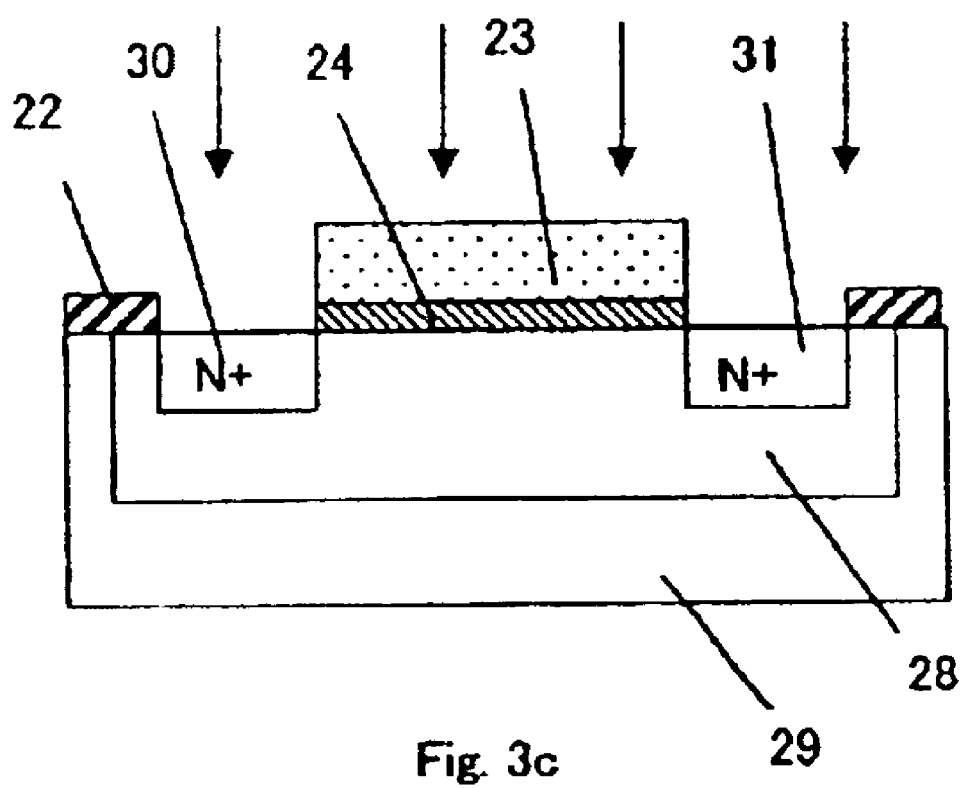
Figure 4:
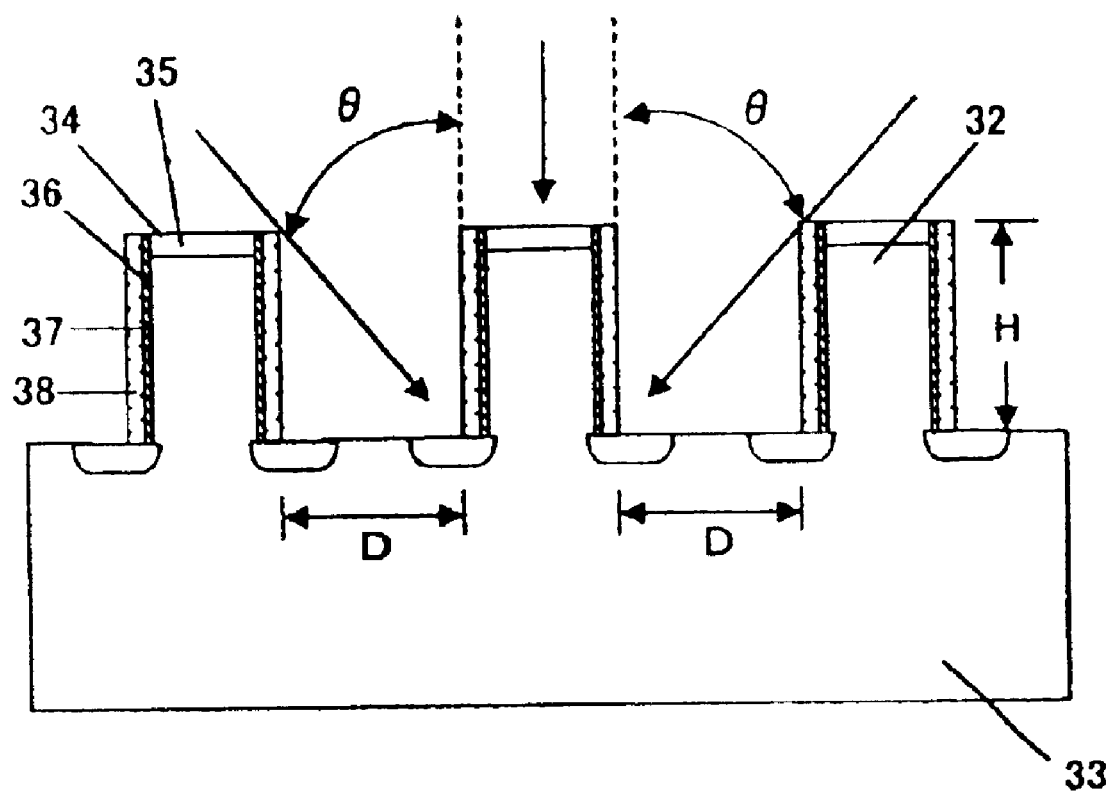
FIG. 4 is a front view in section showing a certain presently preferred embodiment of the process of this invention, illustrating the maximum angle of ion implantation and minimum distance between transistors in adjacent rows.

Referring to FIG. 4, the sidewalls of the fins are implanted at an angle θ. The angle θ and the distance D between the rows are selected so that the fins in one row shield the substrate in between the fins from the radiation, yet permit the radiation to impinge upon the sidewalls of the fins in the adjacent row. In effect, the shadows of the fins in one row fall at the base of the fins in the next row. If an SGT transistor is to be fabricated, the fins in the rows can shield the substrate for one angled radiation exposure, then the fins in the columns can shield the substrate for a second angled radiation exposure at 90 degrees to the first exposure. The above-described angled and multi-directional ion implantations can be achieved by providing a wafer holder that can be rotated 360 degrees holding wafers at an angle of 0 to 75 degrees to the ion beam direction.

FIG. 4 shows an embodiment of the present invention where the ion implantation is multi-directional. In FIG. 4, fins 32 have been fabricated on substrate 33. Each fin 32 has a top 34 with diffused layer 35 and two sidewalls 36 coated with gate oxide 37 and then with gate electrode material 38. Top 34 is implanted in a vertical direction. Fins 32 have been positioned on substrate 33 at a distance D apart. Angle θ, at which sidewalls 36 are implanted, is selected so that top 34 of a fin in one row shields substrate 33 between that fin and the fin in the next row. That is, the ion beam impinges on sidewall 36, but does not impinge on substrate 33. By implanting from each side, both sidewalls 36 can be implanted.

The minimum sidewall layout distance D, the sidewall height H, and the angle θ of ion beam from vertical are related according to the equation D≈H tan θ, where "≈" means "is approximately equal to." Using this equation, the sidewall surfaces can be implanted in a single ion implantation step without using a mask or a special process to protect the substrate because the fins themselves act as a mask to prevent implantation of the substrate. If the substrate is not shielded, it may be implanted, which will adversely affect its stability because a channel may be formed in between the fins. The distance D is the distance needed to shield the substrate, yet permit implantation of the sidewalls of the fins in the adjacent row. The distance D need not be 100% precise, as some implantation of the substrate or failure to implant the bottom of the sidewall of the adjacent fin will not result in a failure of the resulting transistor to function properly. For a 2-sided channel (e.g., FIG. 1a), the distance between the columns need not be equal to the distance D between the rows as implantation does not occur in that direction and shielding is not needed; therefore, the distance between columns can be substantially more or less than the distance D. For 4-sided channels (SGT, e.g., FIG. 2a), the distance between the columns is preferably the same as the distance D between the rows. To implant the sidewalls of fins on the edge of the chip, dummy fins can be fabricated that are not made into transistors or are not connected into the circuit.

The fins (sometimes also referred to as "pillars") are rectangular solids (i.e., each side and the top is a rectangle), but they need not be cubes or have square sides or a square top. Typically, the pillars will be about 0.03 to about 0.13 $\mu$m high and will be about 0.03 to about 0.13 $\mu$m apart (the distance D). The angle θ is typically about 30 to about 75 degrees.

Because the top transistor channel is implanted twice, once when the left sidewall is implanted and once when the right sidewall is implanted, the opposite type of ion can be implanted only on the top surface using a vertical beam, which compensates for the double dose on the top from the two angled implantations.

Figure 5:
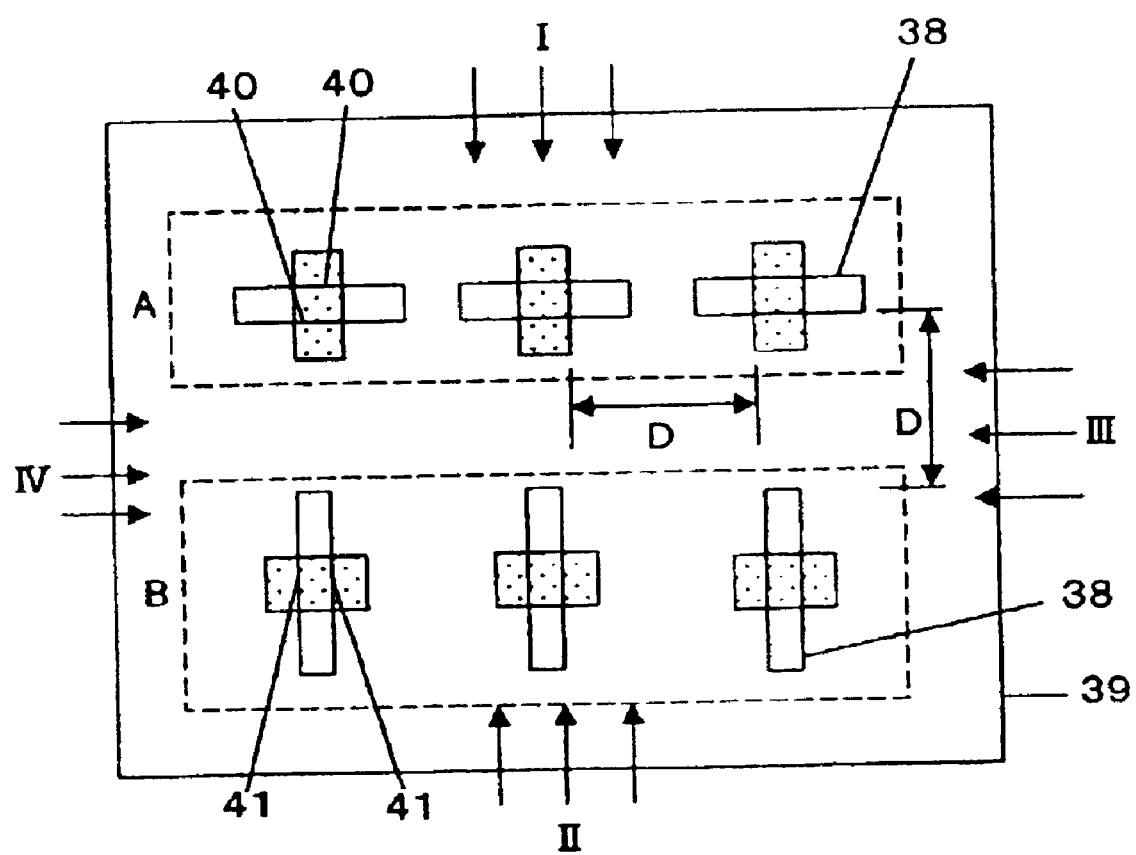
FIG. 5 is a plan view showing two groups of transistors laid out in a square pattern.

FIG. 5 shows another embodiment of the invention. In this embodiment, fin transistors 38 are arranged in a square pattern on a grid of rows and columns on substrate 39. In the ion beam directions of I and II, both sidewalls 40 of the fin transistors of Group A are implanted, but the sidewalls 41 of the fin transistors in Group B are not implanted. On the other hand, in the ion beam direction of III or IV, both sidewalls 41 of the fin transistors in Group B are implanted but the sidewalls 40 of the fin transistors in Group A are not implanted. In both cases, the distance D is the minimum distance needed for a particular angle θ. By turning the transistors at an angle θ of 90 degrees in alternating rows, as shown in FIG. 5, the process of this invention can be used to produce fin transistors on the same substrate that have different threshold voltages.

Figure 6:
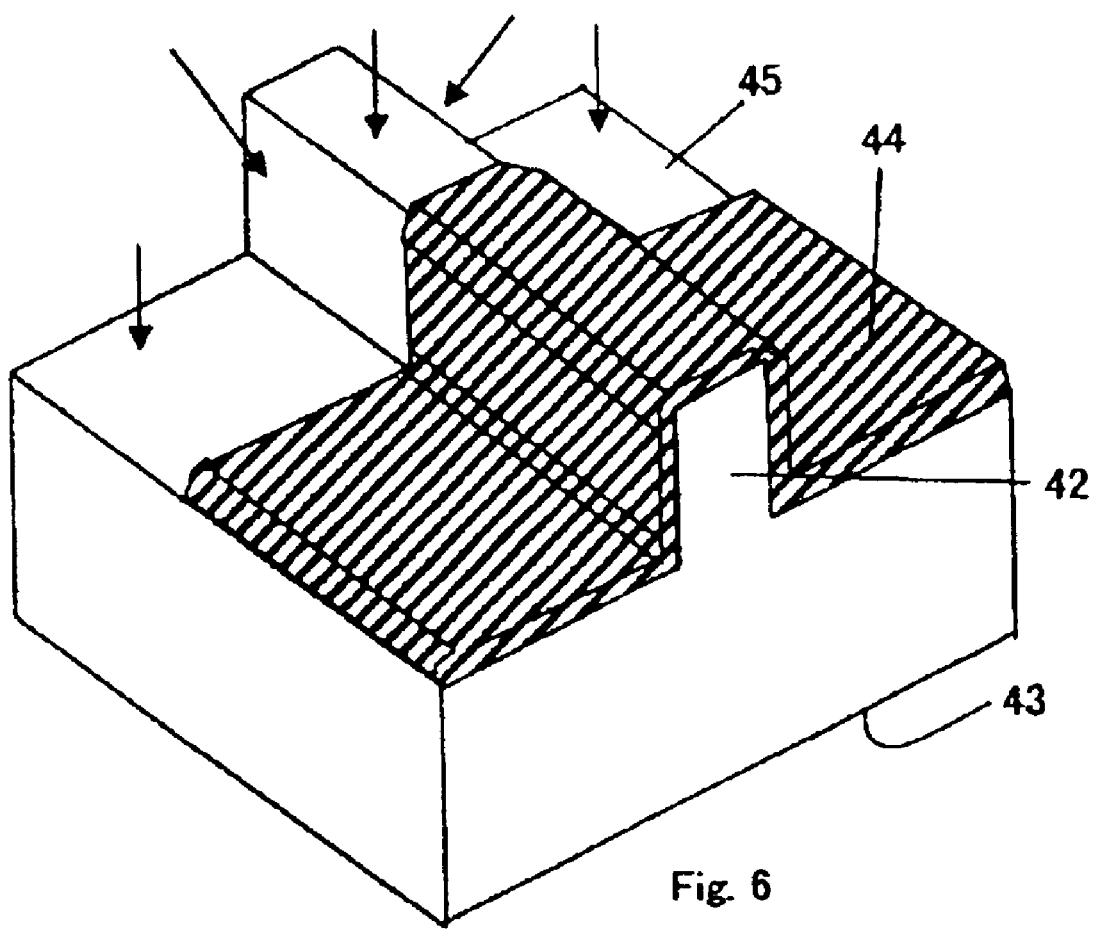
FIG. 6 is an isometric view in section illustrating a process of this invention for fabricating N-type and P-type transistors on the same fin.
Figure 7:
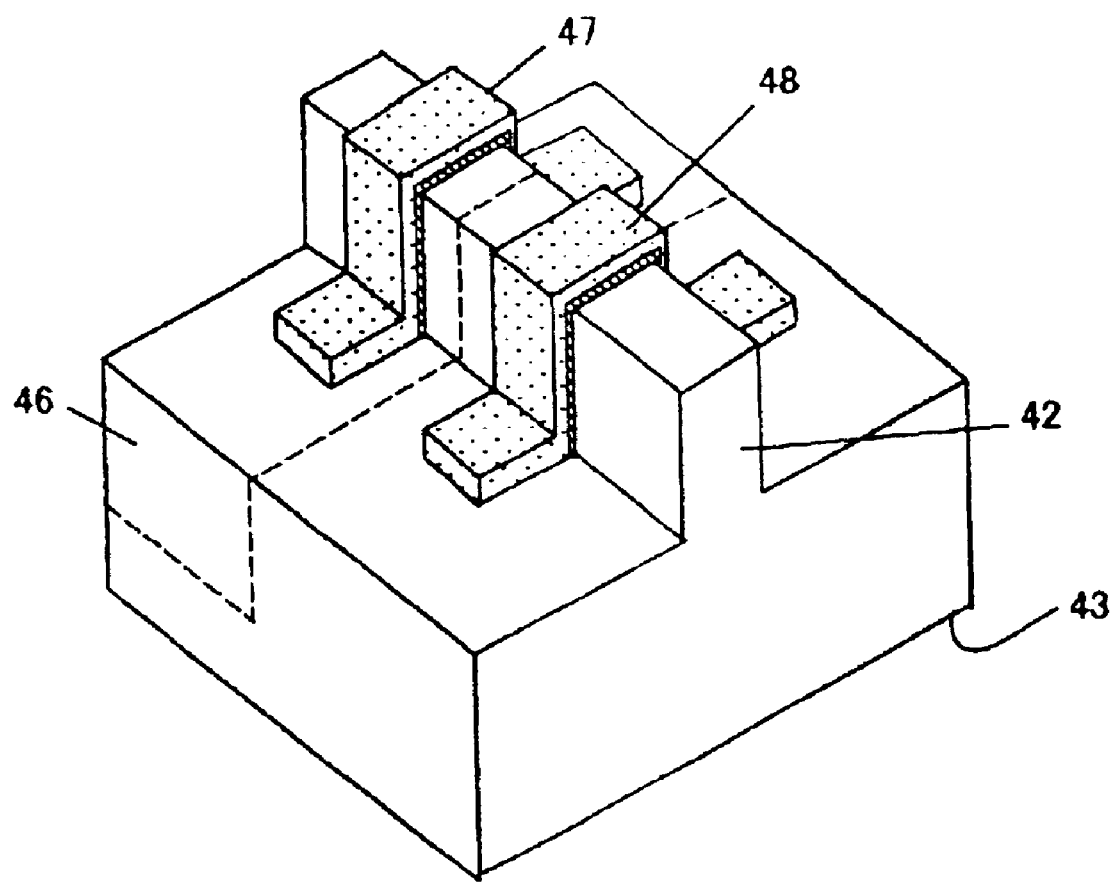
FIG. 7 is an isometric view in section showing the structure formed from the process illustrated in FIG. 6.
Figure 8:
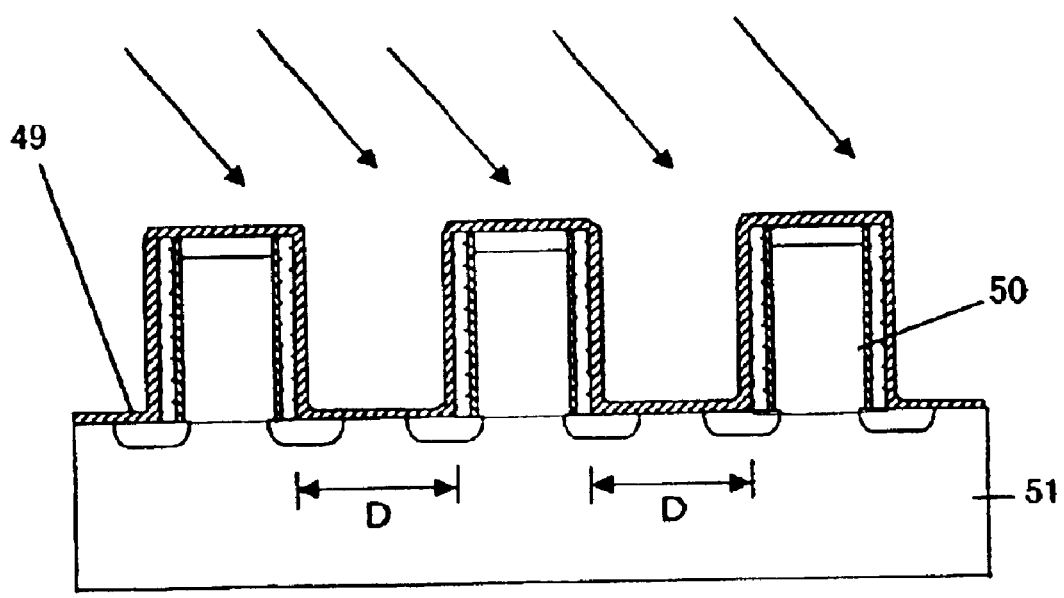
FIG. 8 is a side view in section illustrating another process of this invention, where a photoresist is used.
Figure 9:
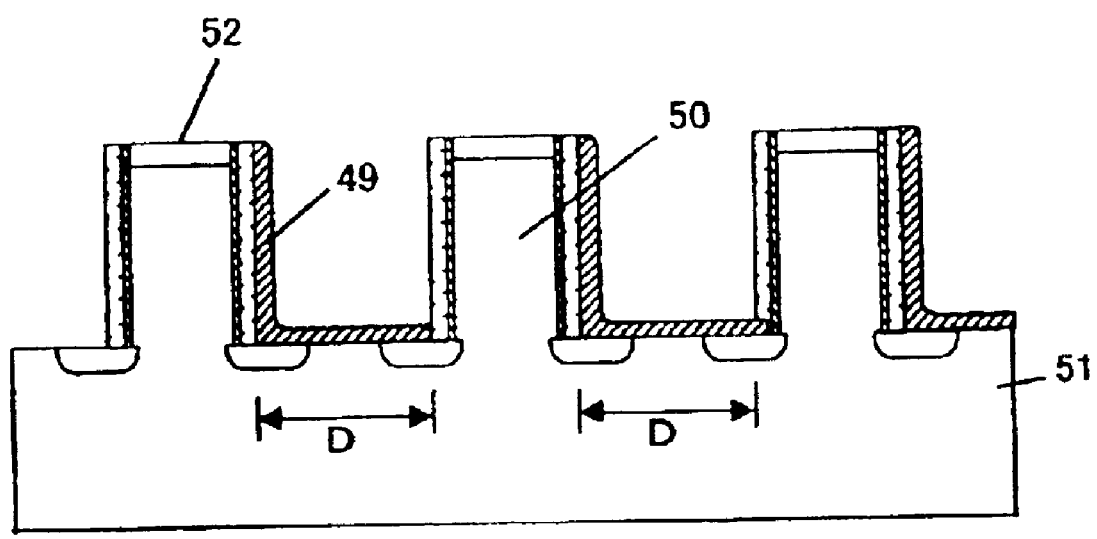
FIG. 9 is a side view in section showing the results of the process illustrated in FIG. 8.

FIGS. 6 and 7 illustrate forming both N and P-type transistors on the same fin. Fin 42 is formed on N-type substrate 43. A portion of the substrate and fin has been protected with photoresist 44 and the remaining portion 45 has been ion implanted with boron from the directions shown to make P-type well 46 in substrate 43. N-type transistor 47 and P-type transistor 48 have been fabricated over fin 42 after removal of photoresist 44, as shown in FIG. 7, thereby producing a CMOS transistor. (U.S. Pat. Nos. 6,255,699 and 6,413,802 also disclose CMOS transistors formed on the same fin. U.S. Pat. No. 6,255,699 shows a P-channel and an N-channel transistor for each sidewall, and the U.S. Pat. No. 6,413,802 shows a stacked fin structure of P- and N-channel transistors. However, both of those inventions require extra process steps.) In FIG. 8, an angled light beam irradiates and develops positive photoresist 49, which covers fins 50 on substrate 51. FIG. 9 shows the results after the exposed pohotoresist has been removed. (If a negative photoresist is used in FIG. 8, it would remain on the top and left sidewalls.) In FIG. 9, top 52 can now be separately implanted using an ion beam coming from any direction so that top 52 and the right and left sidewalls can have different threshold voltages without the need for a mask.

Figure 10:
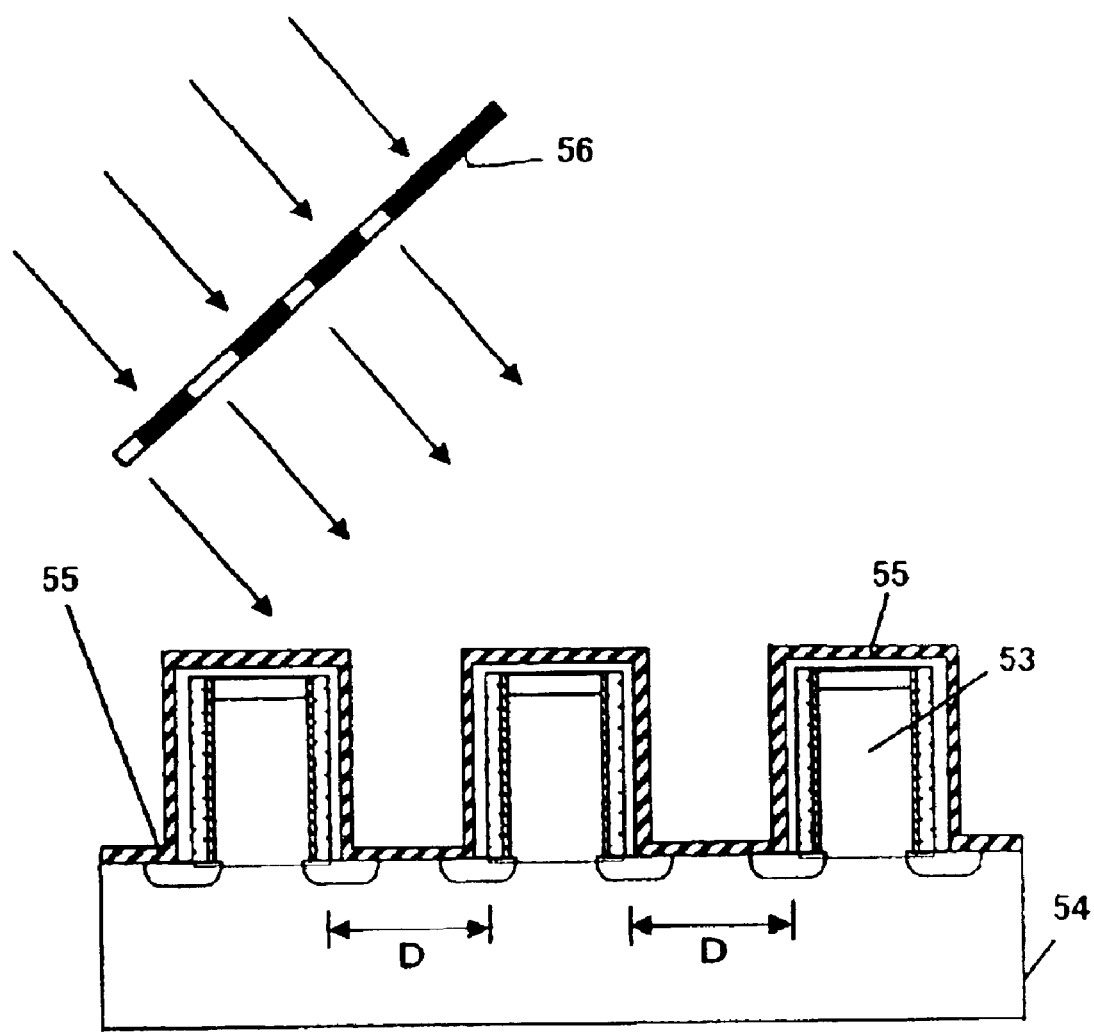
FIG. 10 is a side view in section illustrating the use of a mask patterning step in the process of this invention.
Figure 11:
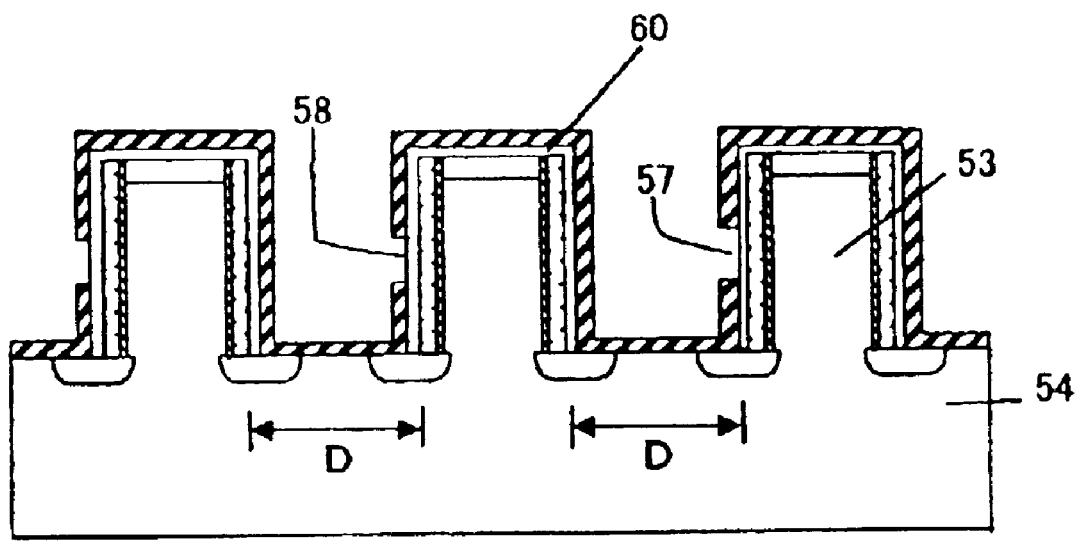
FIG. 11 is a side view in section showing contact holes formed from the process illustrated in FIG. 10.
Figure 12:
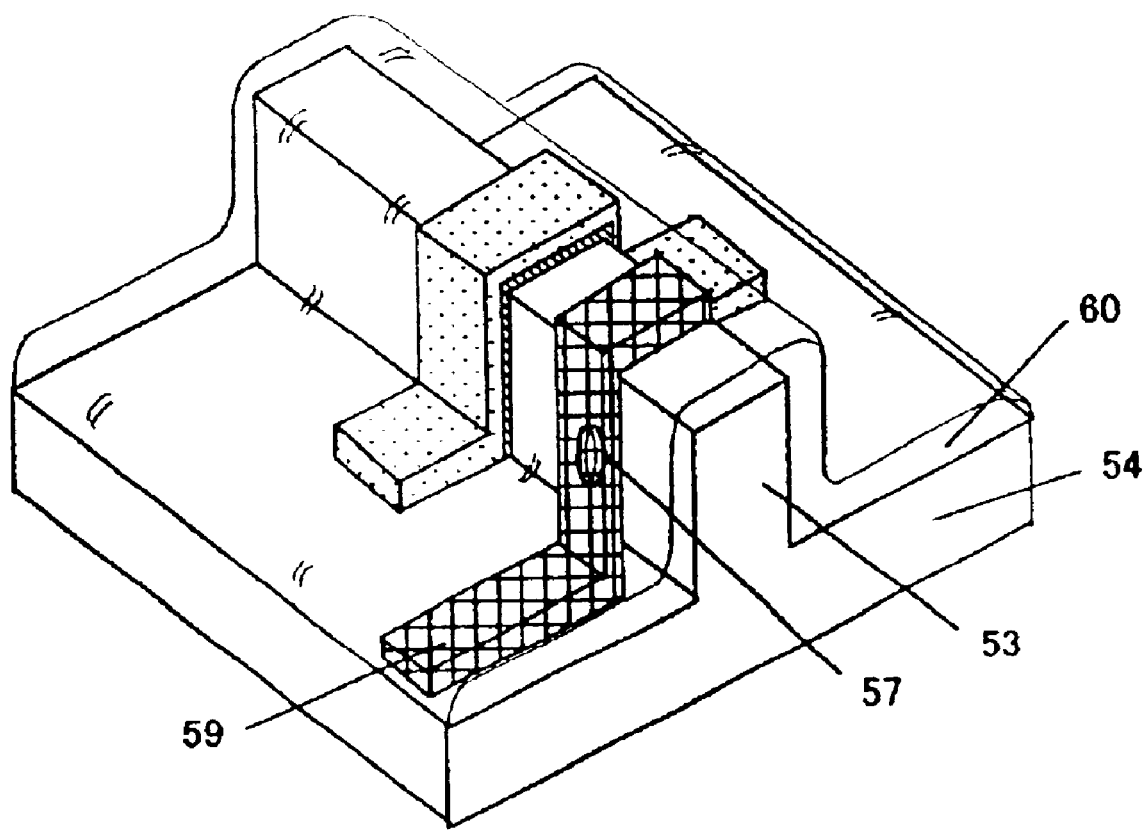
FIG. 12 is an isometric view illustrating the application of a metal layer to the structure shown in FIG. 11.

In FIGS. 10 and 11, fins 53 on substrate 54 have been covered with positive photoresist 55. Light or ions pass through mask 56 to form a pattern 57 on sidewalls 58 of fin 53, as shown in FIG. 11. One embodiment of this pattern on the sidewalls can be contact holes 57. Contact holes 57 through insulator 60 allow electrical access to the drain and source regions. They can be connected with a metal layer 59 over insulator layer 60, as shown in FIG. 12. Because contact holes 57 are on sidewalls 58 instead of on substrate 54, the transistors can be closer together. This sidewall patterning method is also applicable to MEMS (micro electromechanical systems).

Figure 13:
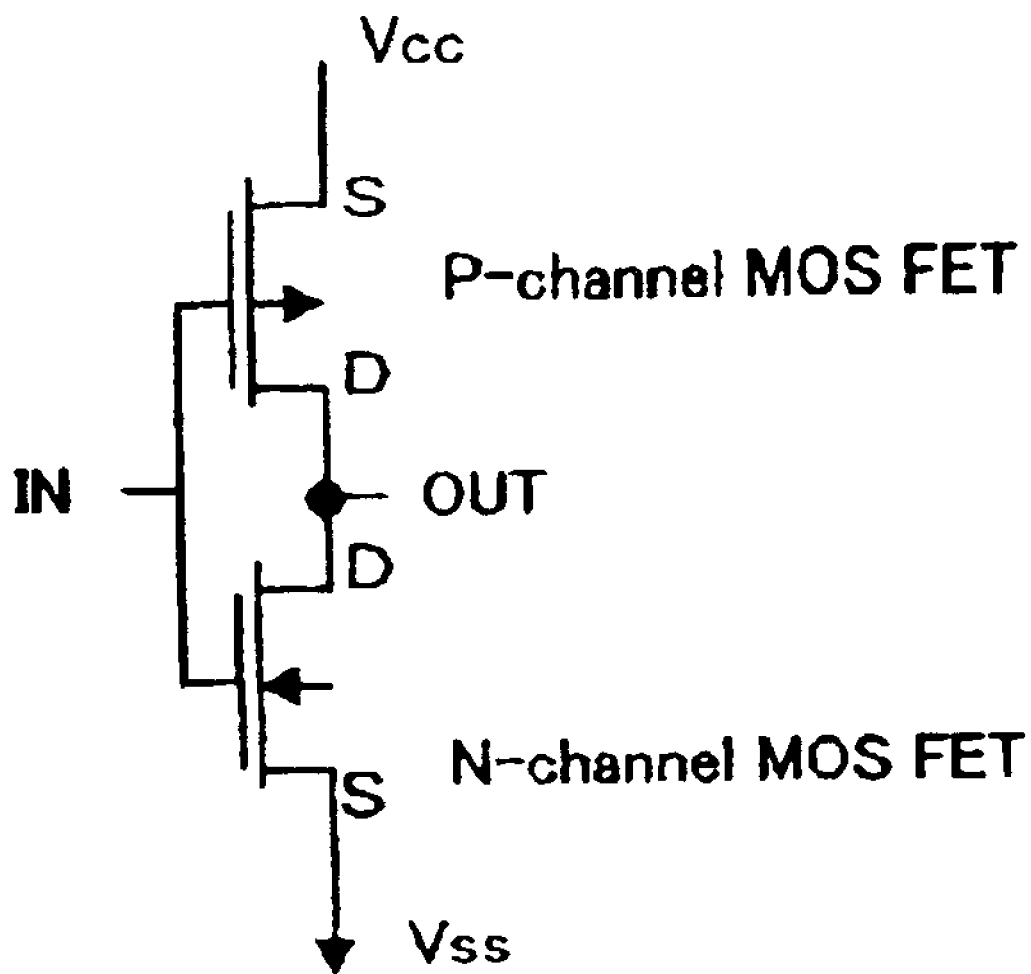
FIG. 13 is a diagram illustrating a conventional inverter circuit for a transistor.
Figure 14:
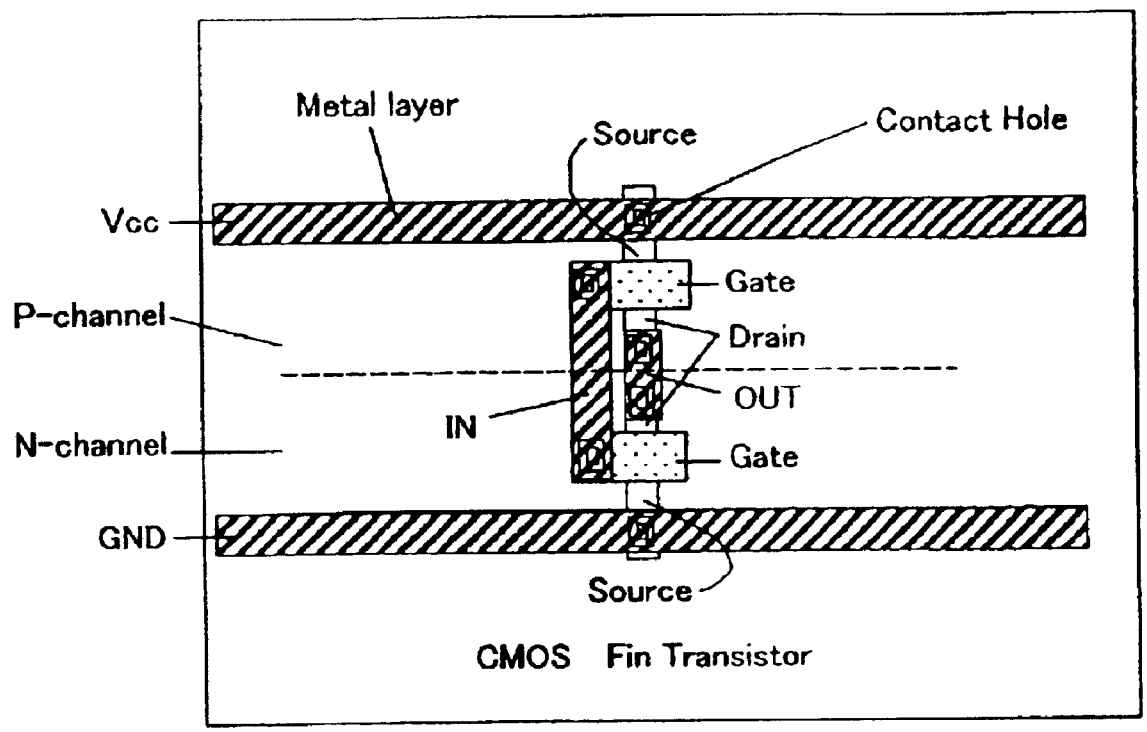
FIG. 14 is a plan view showing an embodiment of the circuit of FIG. 13 using the structure of FIG. 7.

FIG. 14 illustrates an inverter circuit as shown in FIG. 13 and one embodiment of FIG. 7.

Figure 15:
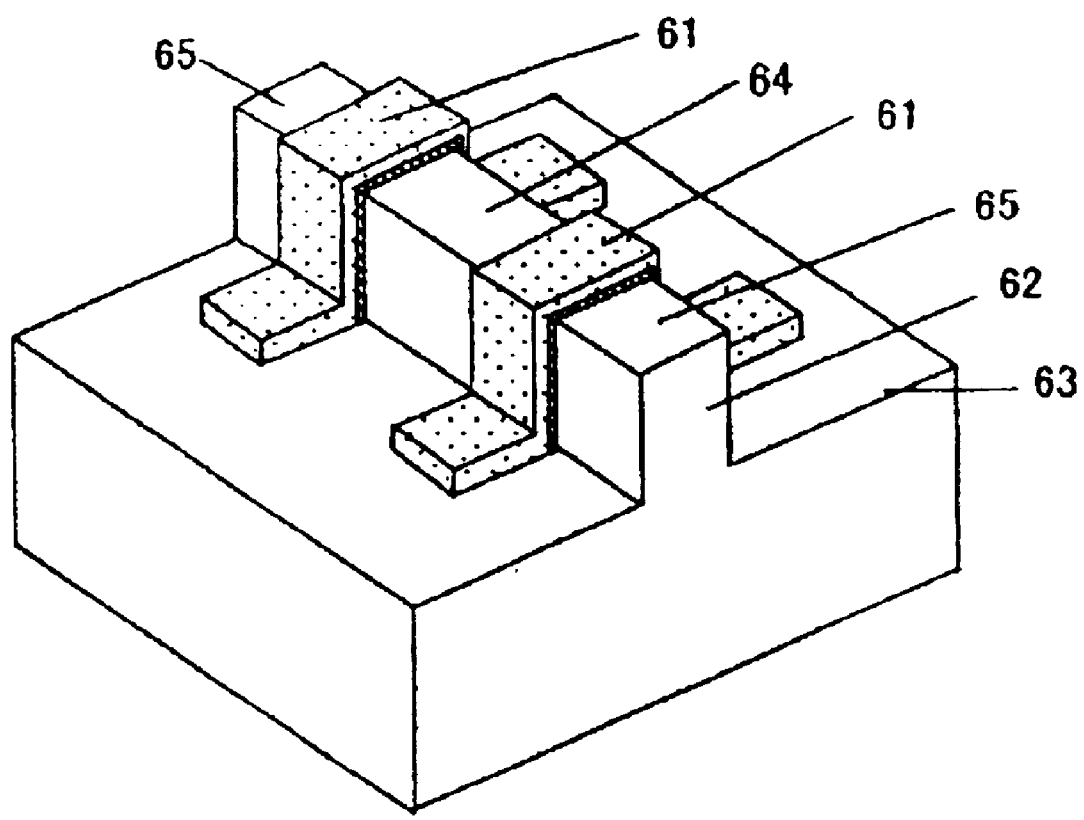
FIG. 15 is an isometric view showing an alternative embodiment of this invention, where the fin transistors have a common source terminal.
Figure 16:
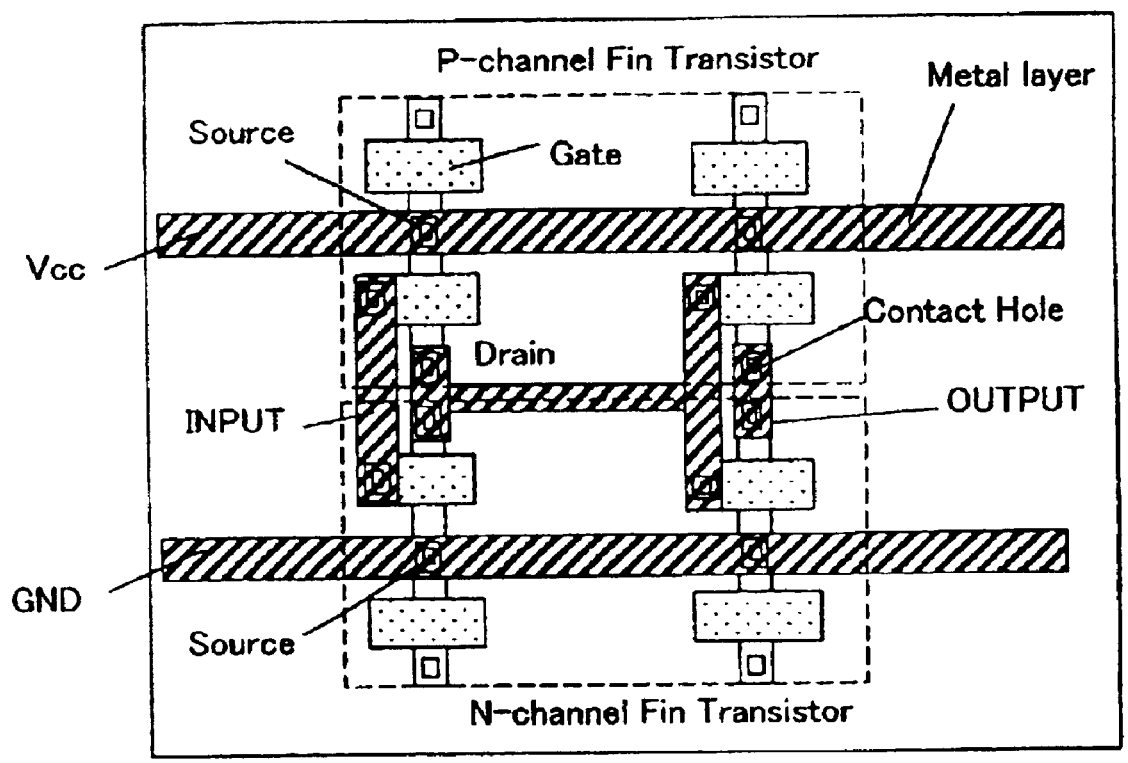
FIG. 16 is a plan view showing an example of an inverter circuit that uses the structure shown in FIG. 15.
Figure 18:
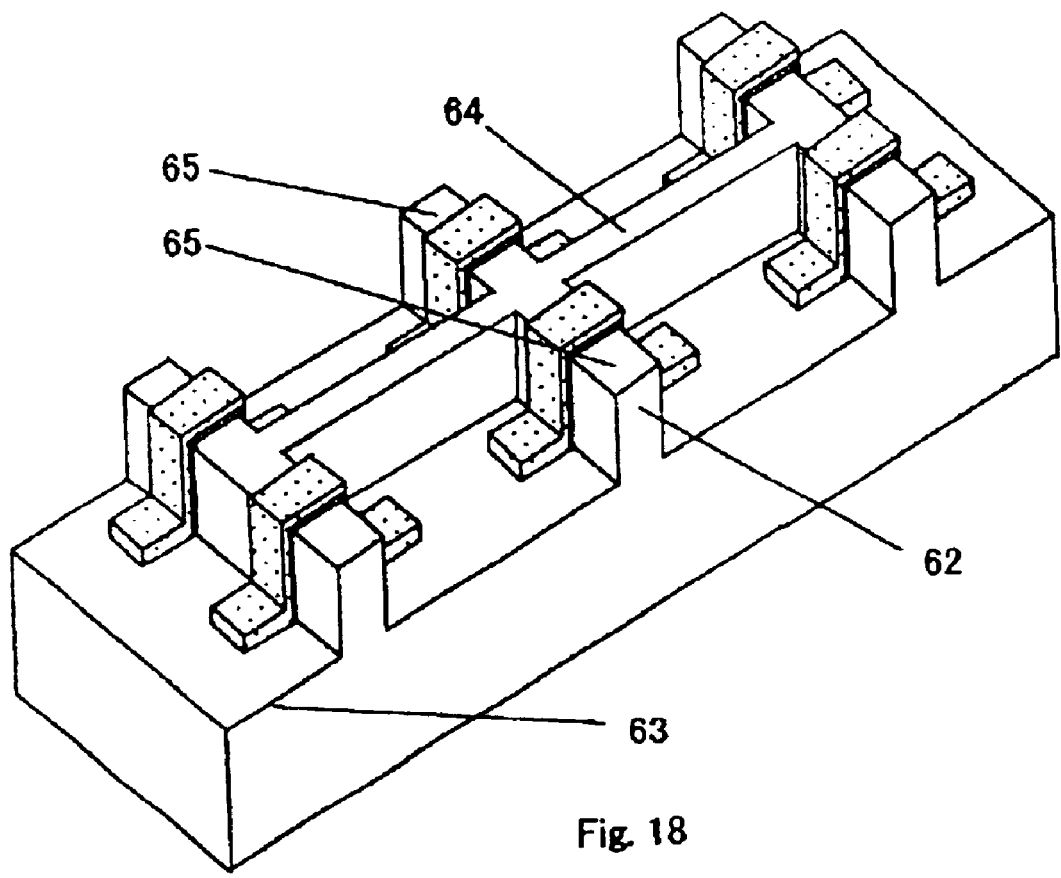
FIG. 18 is an isometric view showing an alternative embodiment of this invention, where the fin transistors have a common source terminal with multi fins.

In FIG. 15, transistors 61 are constructed on a single fin 62 of substrate 63, where source terminal 64 is common and drain terminals 65 are in both directions. By using the common source terminal as shown in FIG. 15, an inverter circuit as shown in FIG. 13 can be made that covers a very small area, giving a structure such as that shown in FIG. 16. (Each area enclosed by dotted lines in FIG. 16 contains two of the structures shown in FIG. 15.) This common source fin structure can be extended to multi-fin structures, as shown in FIG. 18. (Common gate multi-fin structures are disclosed in FIG. 6 of U.S. Pat. No. 6,413,802.) FIG. 17 is similar to FIG. 5, but shows transistors 63 in a checkerboard pattern. In FIG. 17, the distance between the rows (D) is not the same as the distance between the columns (d).

While the invention has been particularly shown and described with reference to a preferred embodiment or, not, it will be understood by those skilled in the art that various changes in form and detail may be made therein without departing from the spirit and scope of the invention.

What is claimed is:

1. A method of fabricating field effect transistors on a semiconductor substrate comprising (A) forming rectangular fins of semiconductor material on said substrate in a rectangular pattern of rows and columns, each fin having a top, four sidewalls, a width, a length, and a height H, where the distance between fins in adjacent rows is D; and (B) irradiating sidewalls of fins in at least one row using radiation with ions at an angle θ to the surface of said sidewall, where D≈H tan θ.

2. A method according to claim 1 wherein said substrate is an SOI (semiconductor on insulator).

3. A method according to claim 1 wherein D is about 0.03 to about 0.13 μm and θ is about 30 to about 75 degrees.

4. A method according to claim 1 wherein said fins are irradiated at both angle θ and at angle −θ.

5. A method according to claim 3 wherein the top of said fins are implanted with the opposite type of dopant from the sides of the fins.

6. A method according to claim 1 wherein said fins are formed in a square pattern.

7. A method according to claim 1 wherein said fins are formed in a checkerboard pattern.

8. A method according to claim 1 wherein the fins in alternating rows are irradiated from different directions, where an angle θ between said directions is 90 degrees.

9. A method according to claim 1 wherein said fins have a greater length than width and an N-channel transistor and a P-channel transistor are formed on the same fin.

10. A fin CMOS transistor made according to the method of claim 9.

11. A method according to claim 9 wherein said N-channel transistor and said P-channel transistor together form an inverter circuit.

12. A method according to claim 1 wherein said transistors have channels on 2 sides.

13. A method according to claim 1 wherein said transistors have channels on 3 sides.

14. A method according to claim 1 wherein said transistors are surrounded gate transistors.

15. A method according to claim 14 including the step of irradiating sidewalls of fins in at least one column using radiation at an angle θ to the surface of said sidewall, where D≈H tan θ.

16. A method according to claim 1 wherein said top and at least 2 of said sidewalls are each separately implanted.

17. A method according to claim 1 wherein said sidewalls are coated with a photoresist and a mask is used to form mask patterns in said sidewalls.

18. A method according to claim 1 wherein said sidewalls are coated with a photoresist and a mask is used to form contact holes in said sidewalls.

19. A method according to claim 18 wherein said contact holes are electrically connected by a metal layer.

20. A method according to claim 1 wherein the length of said fins exceeds their width and two transistors sharing the same source are fabricated on each of said fins.

21. A fin transistor structure made according to the method of claim 1 wherein the length of said fins exceeds their width and two transistors sharing the same source are fabricated on each of said fins.

22. A fin transistor according to claim 21 wherein at least 3 transistors sharing the same source are fabricated on said fins.

23. A method according to claim 1 wherein, between steps (A) and (B), said fins and substrate are coated with a photoresist that remains on one of the sidewalls and substrate between the fins while the top and the other sidewalls of the fins are exposed to the ion beams.

24. In a method of fabricating fin-type field effect transistors on a semiconductor substrate, wherein rectangular fins are formed on said substrate, gate electrodes are deposited on at least two sides of said fins, and said gate electrodes are implanted with ions at an angle θ to a fine perpendicular to said substrate, the improvement comprising placing said rectangular fins on said substrate in a rectangular pattern of rows and columns such that D≈H tan θ, where D is the distance between fins in adjacent rows and H is the height of said fins.

25. A method of fabricating field effect transistors on a semiconductor substrate comprising (A) forming rows of fins of semiconductor material on said substrate in a rectangular pattern of rows and columns, where each fin has a length sufficient for the fabrication of at least 2 transistors thereon, each fin has a top and four sidewalls, a width, a length, and a height H, where the distance between fins in adjacent rows is D; and (B) irradiating the sidewalls of fins in one row using radiation with ions at an angle θ to the surface of said sidewall, where D=H tan θ.

* * * * *